US009627555B2

(12) United States Patent
Marroquin et al.

(10) Patent No.: US 9,627,555 B2
(45) Date of Patent: Apr. 18, 2017

(54) POWER INVERTER DOCKING SYSTEM FOR PHOTOVOLTAIC MODULES

(71) Applicant: SunPower Corporation, San Jose, CA (US)

(72) Inventors: Marco A. Marroquin, Austin, TX (US); Stephen P. Wurmlinger, Scurry, TX (US); Thomas P. Parker, Dallas, TX (US); Robert S. Balog, College Station, TX (US)

(73) Assignee: SunPower Corporation, San Jose, CA (US)

( * ) Notice: Subject to any disclaimer, the term of this patent is extended or adjusted under 35 U.S.C. 154(b) by 148 days.

(21) Appl. No.: 14/589,655

(22) Filed: Jan. 5, 2015

(65) Prior Publication Data

US 2015/0122305 A1    May 7, 2015

Related U.S. Application Data

(63) Continuation of application No. 13/915,165, filed on Jun. 11, 2013, now Pat. No. 8,929,094, which is a
(Continued)

(51) Int. Cl.
| | |
|---|---|
| *H01L 31/02* | (2006.01) |
| *H05K 7/10* | (2006.01) |
| *H02S 40/32* | (2014.01) |
| *H02S 40/34* | (2014.01) |
| *H01L 31/042* | (2014.01) |
| *H01L 31/048* | (2014.01) |

(52) U.S. Cl.
CPC ........ *H01L 31/0201* (2013.01); *H01L 31/042* (2013.01); *H01L 31/048* (2013.01);
(Continued)

(58) Field of Classification Search
CPC ........... H01L 31/02008; H01L 31/0201; H01L 31/02013
See application file for complete search history.

(56) References Cited

U.S. PATENT DOCUMENTS 7,301,755 B2 * 11/2007 Rodriguez ........... H05K 7/1432
                                               165/185
7,667,963 B2 *  2/2010 Illerhaus  ............... H02M 7/003
                                               361/688
(Continued)

FOREIGN PATENT DOCUMENTS

WO    2009/088977 A1    7/2009

OTHER PUBLICATIONS

European Search Report for Application No. 16184695.1-1504, dated Nov. 3, 2016, 7 pages.

*Primary Examiner* — Anthony Q Edwards
(74) *Attorney, Agent, or Firm* — Barnes & Thornburg LLP

(57) ABSTRACT

An electronics module docking system includes docking member removably coupled to a photovoltaic module. The docking system includes a first connector port electrically coupled to one or more photovoltaic cells of the photovoltaic module. The photovoltaic module is selectively coupleable to the docking member. The docking system includes a housing to enclose an electronics module. The housing may include second connector port that is selectively engageable to the power electronics module. The power electronics module and the photovoltaic cells are electrically coupled to one another upon selective engagement of the connector ports. The inverter housing is receivable by and removably coupleable to the docking member allowing the inverter housing to be removably coupleable to the photovoltaic module.

20 Claims, 11 Drawing Sheets

Related U.S. Application Data continuation of application No. 12/609,742, filed on Oct. 30, 2009, now Pat. No. 8,462,518.

(60) Provisional application No. 61/250,559, filed on Oct. 12, 2009.

(52) U.S. Cl.
CPC .............. *H02S 40/32* (2014.12); *H02S 40/34* (2014.12); *H05K 7/10* (2013.01); *Y02E 10/50* (2013.01); *Y10T 29/49002* (2015.01)

(56) References Cited

U.S. PATENT DOCUMENTS

| | | | |
|---|---|---|---|
| 7,824,189 B1* | 11/2010 | Lauermann | H02S 40/34 136/246 |
| 2006/0079113 A1 | 4/2006 | Minich | |
| 2008/0180909 A1* | 7/2008 | Illerhaus | H02M 7/003 361/694 |
| 2010/0105245 A1* | 4/2010 | Good | H02S 40/34 439/571 |
| 2010/0263714 A1* | 10/2010 | Lauermann | H02S 40/34 136/251 |
| 2010/0275976 A1* | 11/2010 | Rubin | H01L 31/02008 136/251 |
| 2010/0326490 A1* | 12/2010 | Tagliareni | H01L 31/02008 136/244 |
| 2011/0290303 A1* | 12/2011 | Weldon | H01R 13/74 136/251 |
| 2012/0097215 A1* | 4/2012 | Vermeersch | H01L 31/02008 136/246 |

* cited by examiner

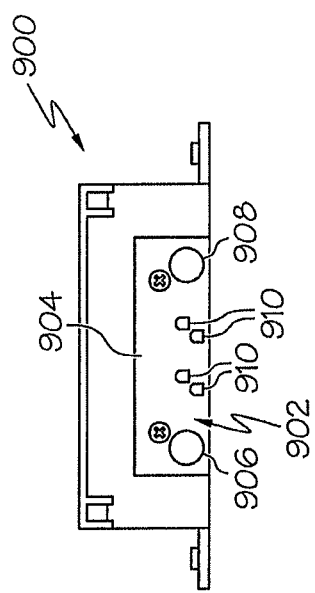
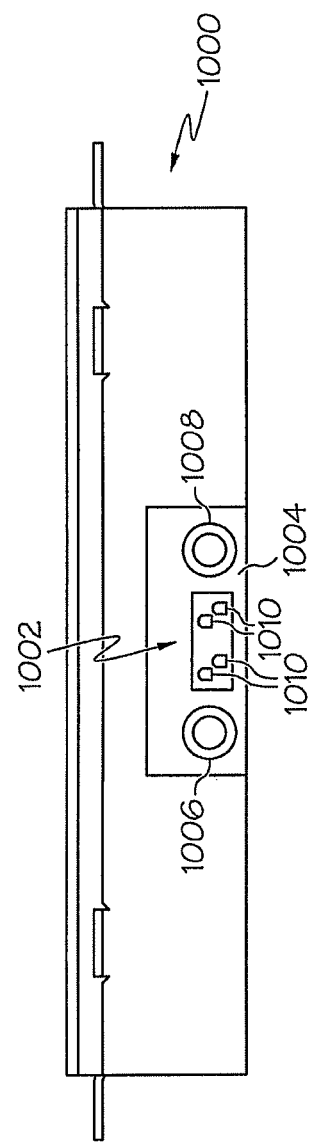

POWER INVERTER DOCKING SYSTEM FOR PHOTOVOLTAIC MODULES

CROSS-REFERENCE TO RELATED U.S. PATENT APPLICATIONS

The present application is a continuation application of U.S. application Ser. No. 13/915,165, entitled "Power Inverter Docking System for Photovoltaic Module" by Marco A. Marroquin et al., which was filed on Jun. 11, 2013, and which is a continuation application of U.S. application Ser. No. 12/609,742, now U.S. Pat. No. 8,462,518, entitled "Power Inverter Docking System for Photovoltaic Modules" by Marco A. Marroquin et al., which was filed on Oct. 30, 2009, and which claims priority under 35 U.S.C. §119(e) to U.S. Provisional Patent Application No. 61/250,559, entitled "POWER INVERTER DOCKING SYSTEM FOR PHOTOVOLTAIC MODULES" by Marco A. Marroquin, which was filed on Oct. 12, 2009, the entirety of each of which is hereby incorporated by reference.

TECHNICAL FIELD

This invention relates to power electronic docking systems, and more specifically to power inverter docking systems for photovoltaic modules.

BACKGROUND

Typical photovoltaic (PV) modules may generate direct current (DC) power based on received solar energy. PV modules may include a plurality of PV cells electrically coupled to one another allowing the PV cells to contribute to a combined output power for a PV module. In particular applications, the DC power generated by a photovoltaic module may be converted to AC power through the use of a power inverter. The power inverter may be electrically coupled to an output of the PV module. Typically, intervening wiring may be used between the PV module and the power inverter. The power inverter may be directly connected to wires included in the intervening wiring. The power inverter may be located physically apart from the PV module, with only the intervening wiring and associated hardware physically coupling the PV module to the power inverter.

SUMMARY

According to one aspect of the disclosure, a power inverter docking system may be used to removably couple a power inverter to a photovoltaic (PV) module. The docking system may include a docking member that may be removably coupled to the PV module. The PV module may include one or more connectors electrically coupled to one or more PV cells of the PV module. The docking system may include a junction box having a PV connector port. The junction box may enclose an electrical coupling of the PV connector port and the connectors of the PV module. The junction box may be removably coupled to the docking member.

The docking system may also include an inverter housing to enclose a power inverter. The inverter housing may include an inverter housing connector port that may be electrically coupled to the power inverter. The inverter housing may selectively engage the junction box to form a connection between the inverter housing connector port and the PV connector port. The inverter housing may be removably coupled to the docking member to secure the inverter housing with respect to the PV module. The power inverter may convert direct current (DC) power generated by the PV module to alternating current (AC) power for various AC power applications.

According to another aspect of the disclosure, a method of assembling a power inverter docking system of a PV module may be implemented. The method may include removably coupling a docking member to the PV module. The method may further include electrically coupling a PV connector port to the PV module. The method may further include removably coupling a junction box including the PV connector port to the docking member. The method may further include removably coupling the PV connector port to the docking member. The method may further include electrically coupling an inverter housing connector port electrically coupled to a power inverter to the PV connector port. The method may further include removably coupling an inverter housing that encloses the power inverter to the docking member.

BRIEF DESCRIPTION OF THE DRAWINGS

The disclosure may be better understood with reference to the following drawings and description. The components in the figures are not necessarily to scale, emphasis instead being placed upon illustrating the principles of the invention. Moreover, in the figures, like referenced numerals designate corresponding parts throughout the different views:

FIG. 9 is an elevation view of an alternative example junction box.

FIG. 10 is an elevation view of an alternative example inverter housing.

DETAILED DESCRIPTION OF THE DRAWINGS

A docking system may be implemented for a photovoltaic module. The docking system may include docking member removably coupled to or integrally formed with a photovoltaic module. The docking system may also include a photovoltaic connector port electrically coupled to photovoltaic cells of the photovoltaic module. The photovoltaic module may be selectively coupled to the docking member. The docking system may also include a housing to enclose a power electronics module, such as a power inverter or converter. The housing may include an inverter housing connector port that is selectively engageable to the power electronics module. The power electronics module and the photovoltaic cells may be electrically coupled to one another upon selective engagement of the connector ports. The inverter housing may be received by and removably coupled to the docking member allowing the inverter housing to be removably coupled to the photovoltaic module.

Figure 1:
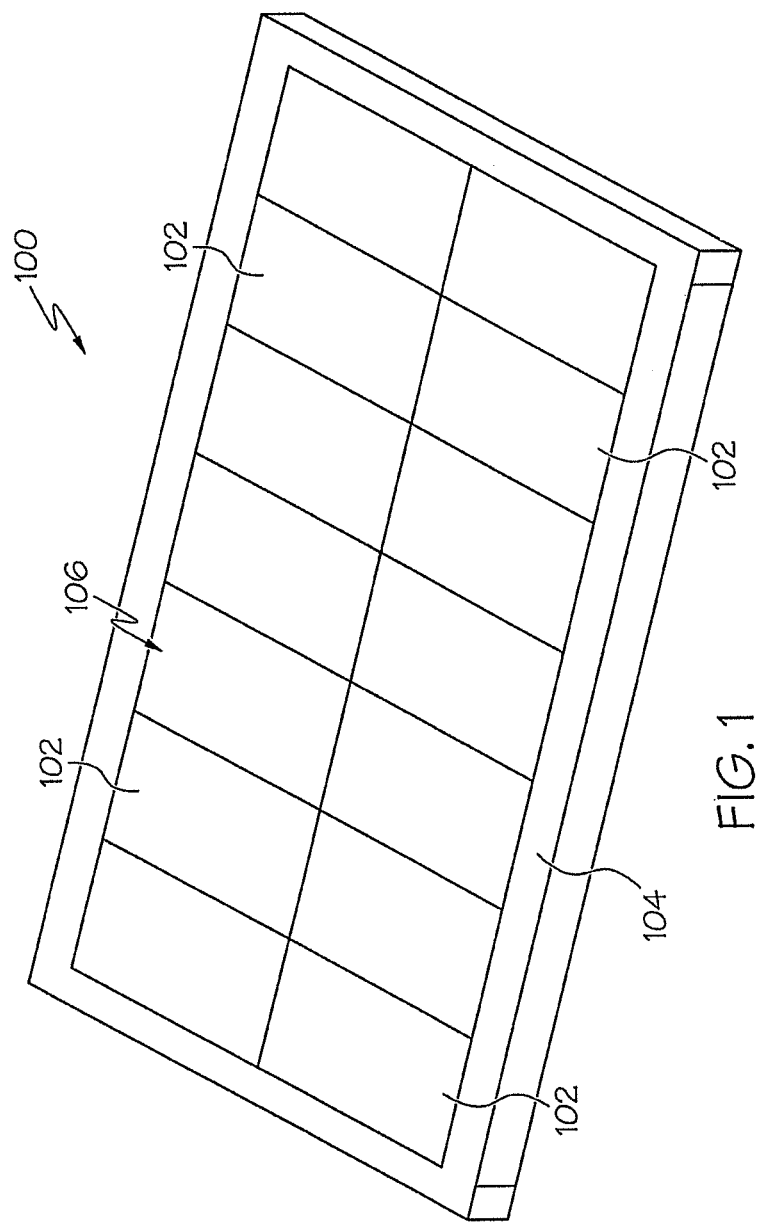
FIG. 1 is perspective view of an example photovoltaic (PV) module.

FIG. 1 is a perspective view of a photovoltaic module (PV) module 100. The PV module 100 may include a plurality of PV cells 102 disposed within a frame 104 of the PV module 100. The PV cells 102 may be electrically coupled in various configurations, such as sub-groups of PV cells 102 for example. The PV cells 102 may be configured to be exposed along a top surface 106 of the PV module 100 allowing the PV cells 102 to receive solar energy and convert the solar energy into electric power. The electric power produced by the PV cells 102 is direct-current (DC) based. In one example, the DC power from the PV cells 102 may be converted to alternating current (AC) power for use in AC power applications such as distribution portions of utility power grids.

Figure 2:
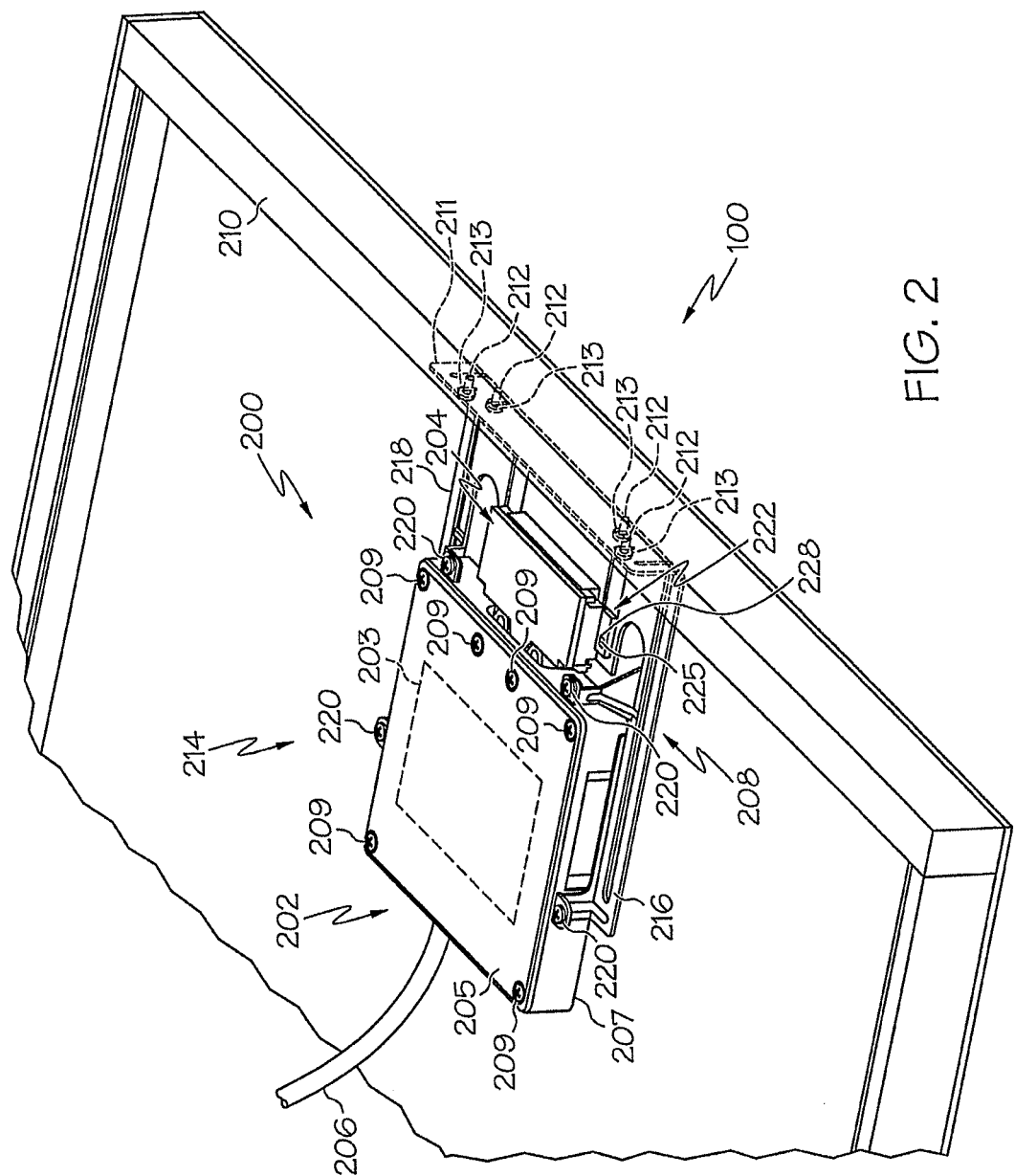
FIG. 2 is a perspective view of a PV module including an example power inverter docking system.

FIG. 2 is a perspective view of an underside of the photovoltaic (PV) module 100. A docking system 200 may include an inverter housing 202 removably coupled to the PV module 100. The inverter housing 202 may enclose a power inverter 203, conceptually represented in phantom in FIG. 2. In one example, the inverter housing 202 may be formed of an inverter housing cover 205 and an inverter housing enclosure 207 removably coupled to one another by a plurality of fasteners 209. In FIG. 2, the fasteners 209 may be threaded fasteners such as screws or bolts. The power inverter 203 may be electrically coupled to the PV cells 102 of the PV module 100. Various topologies may be used for the power inverter 203 such as a DC link inverter, AC link inverter, transformerless inverter, or any other suitable inverter topology. The power inverter 203 may provide a single-phase or a three-phase output. The inverter 203 topology may be constructed with multiple power stages, one of which may be an active filter converter. In alternative examples, the inverter housing 202 may be used to enclose one or more power inverters 203 or other power converter modules, such as DC-DC power converters, that may be electrically coupled to the PV module 100 for various applications. In other examples, one or more power converters may be electrically coupled to the PV module 100 and the power inverter 203.

A junction box 204 may provide electrical access to the PV cells 102 of the PV module 100 to the power inverter 203. In FIG. 2, the junction box 204 may be electrically coupled to the power inverter 203 enclosed within the inverter housing 202, allowing DC power generated by the PV module 100 to be converted to AC power and transmitted through a plurality of electrical conductors (FIG. 7) electrically coupled to the power inverter 203. The conductors may be disposed within an electrical cable 206. In one example, the junction box 204 may be formed of a non-electrically-conductive material such as plastic, resin, or a composite material, for example. In other examples, the junction box 204 may be formed of an electrically-conductive material.

A docking member 208 may be secured to the PV module 100. In FIG. 2, the docking member 208 may include a bracket 211 that may be removably coupled to a rail 210 of the PV module 100 through a plurality of fasteners 212. The rail 210 may be part of the frame 104. The bracket 211 may include a plurality of openings 213 to receive the fasteners 212. In FIG. 2, the fasteners 212 are illustrated as threaded fasteners, such as screws or bolts. However, various other fasteners, such as adhesives, clips, or other suitable coupling mechanisms may be used to removably couple the docking member 208 to the PV module 100. The docking member 208 may also be permanently or removably fastened to a surface 214 of the PV module 100 through the use of various suitable fastening manners such as fasteners, adhesives, or soldering, for example. In alternative examples, the docking member 208 may be secured to the PV module 100 in a manner other than that shown in FIG. 2. For example, the docking member 208 may be configured to be secured to the PV module 100 without being secured to both the rail 210 and the surface 214 of the PV module. In other examples, the docking member 208 may be integrally formed with the PV module 100, such as with the surface 214.

The docking member 208 may be removably coupled to the inverter housing 202 and the junction box 204. The docking member 208 may include a first rail 216 and a second rail 218. The inverter housing 202 may be selectively received by the docking member 208 and the inverter housing 202 may be disposed between the rails 216, 218. The inverter housing 202 may be removably coupled to the docking member 208 through fasteners 220. Removable coupling allows the inverter housing 202 to be removed from the docking system 200 allowing repair, replacement, etc., of the inverter housing 202. In FIG. 2, the fasteners 220 may be captive threaded fasteners, such as captive screws or bolts. The fasteners 220 may also be any other suitable fasteners, such as clips, for example, allowing coupling. The docking member 208 may also include a first junction box slot 222 and a second junction box slot 224 (FIG. 3) allowing the junction box 204 to be removably coupled to the docking member 208. The junction box 204 may include a first tab 225 (FIG. 3) and a second tab 227 (FIG. 5) that may disposed through a first opening 228 and a second opening 230 (FIG. 3) of the slots 222, 224, respectively.

The inverter housing 202 and docking member 208 may be formed of an electrically conductive material, such as a metal. The electrically-conductive material may assist with grounding of the inverter housing 202, which is in contact with the docking member 208. The docking member 208 may be in contact with the surface 214 of the PV module 100, which may also be formed of an electrically conductive material. A chain of contact such as this may provide grounding for the inverter housing 202. A grounding conductor 712 (see FIG. 7) may also be provided to the inverter housing module 202 included in the cable 206 or external to the cable 206. The grounding cable may terminate within the inverter housing 202, which may also provide grounding to the docking member 208.

Figure 3:
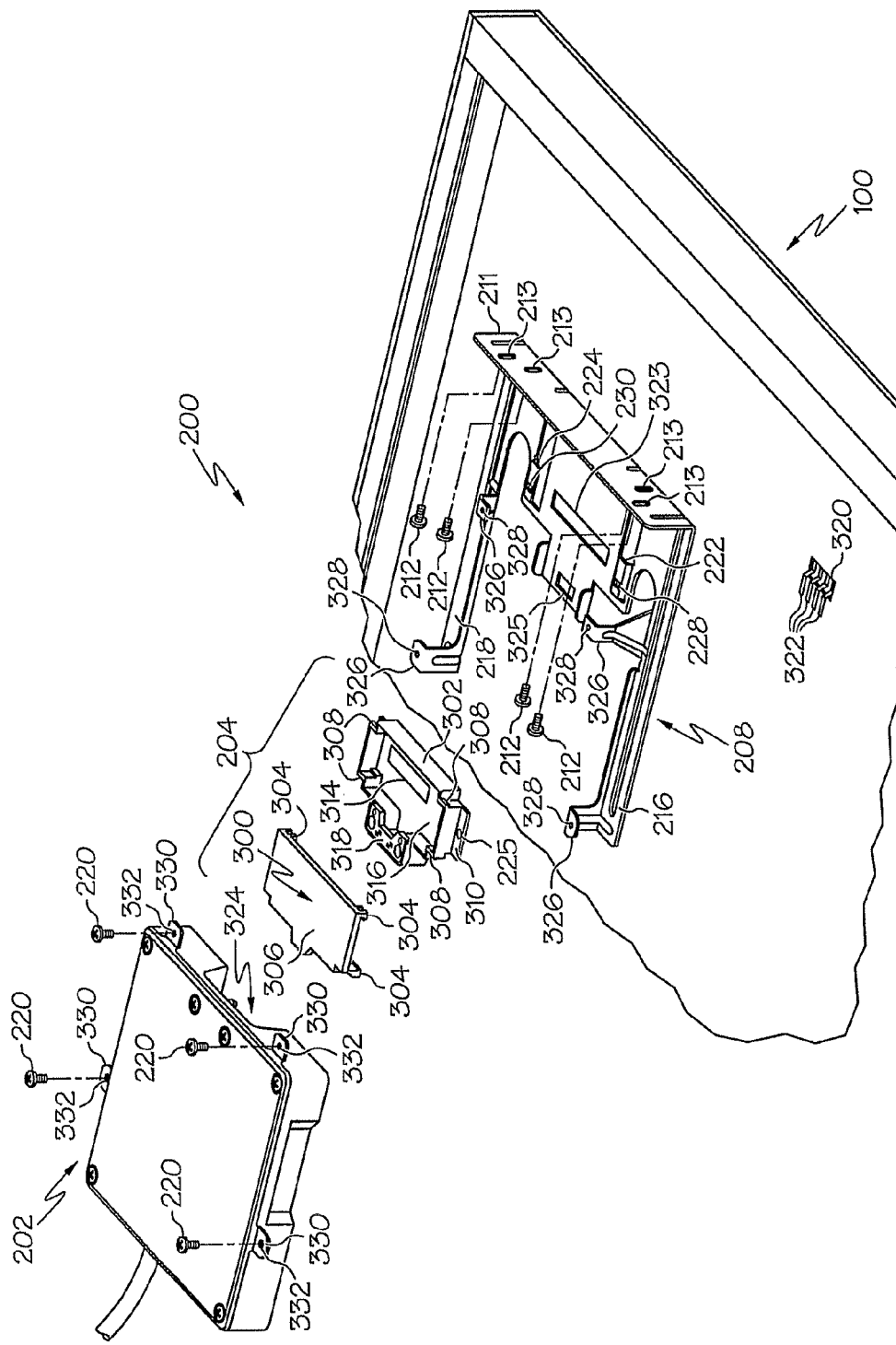
FIG. 3 is an exploded perspective view of FIG. 2.

FIG. 3 shows an exploded view of one example of the docking system 200 and PV module 100. The junction box 204 may include a cover 300 and an enclosure 302. The cover 300 may be removably coupled to the enclosure 302. The cover 300 of the junction box 204 may include a plurality of clip arms 304. Each clip arm 304 may extend from a body 306 of the cover 300. Each clip arm 304 may correspond to one of a plurality of cover receivers 308. In one example, each cover receiver 308 may be a ridge formed in the enclosure 302 for engagement with a corresponding clip arm 304. The cover 300 may be pressed onto the enclosure 302 causing each clip arm 304 to engage one of the cover receivers 308, such as being forced around each corresponding cover receiver 308 biasing each clip arm 304 from an initial respective resting position shown in FIG. 3. Each clip arm 304 may be resilient allowing each clip arm 304 to attempt to return to the initial resting position causing the clip arms 304 to engage the corresponding cover receiver 308 to removably couple the cover 300 to the enclosure 302, as shown in FIG. 2. Other suitable manners of removably coupling the cover 300 to the enclosure 302 may be implemented. In alternative examples, the cover 300 may be coupled to the enclosure 302 through a hinge, allowing the cover 300 to pivot between an open and closed position allowing internal access to the enclosure 302.

Figure 5:
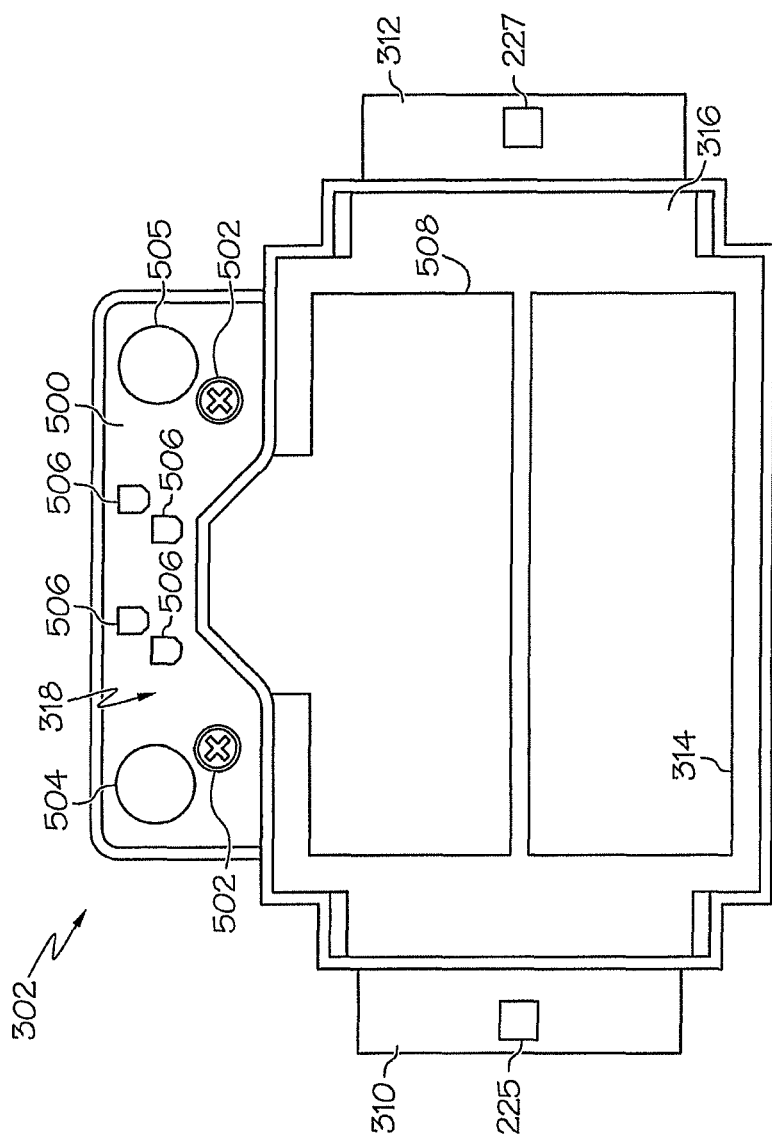
FIG. 5 is a plan view of an example junction box of the power inverter docking system of FIG. 2.

The enclosure 302 may include a first docking projection 310 and a second docking projection 312 (FIG. 5). Each docking projection 310, 312 may slide within a corresponding slot 222, 224 of the docking member 208. The openings 228, 230 may each receive the respective tab 225, 227 on each of the projections 310, 312. Receipt of each tab 225, 227 may secure the enclosure 302 of the junction box 204 into place with respect to the docking member 208. In the example shown in FIG. 3, the projections 310, 312 may be received by slots 222, 224, respectively, in a plane substantially parallel to the surface 214. The tabs 225, 227 may be received by the openings 228, 230, respectively, in a plane substantially perpendicular to the surface 214.

The enclosure 302 may include an enclosure access opening 314, such as a slot, disposed through a surface 316 of the enclosure 302. The enclosure 302 may also include a PV connector port 318. As discussed later, the enclosure 302 may be positioned to align the enclosure access opening 314 with a PV module opening 320, such as a slot. The PV module opening 320 may be disposed in the surface 214 and allow access to connectors 322 of the PV module 100. In one example, the docking member 208 may include a PV access opening 323, such as a slot, that may be aligned with the enclosure access opening 314 and the PV module opening 320. Alignment of the openings 314, 320, and 323 allows access to the connectors 322 for electrically coupling to the PV connector port 318 of junction box 204. In one example, the connectors 322 may be ribbon connectors electrically connected to the PV cells 102 of the PV module 100. However, other connectors, such as wires, may be implemented in the PV module 100 allowing electrical interfacing with the PV cells 102. In one example, the docking member 208 may include a junction box access opening 325 allowing for further internal access to the junction box 204.

The PV connector port 318 may be removably coupled to an inverter housing connector port 324 of the inverter housing 202. In the example of FIG. 3, the inverter housing connector port 318 may be selectively engaged and disengaged with the PV connector port 324 along a plane substantially parallel to the surface 214. The inverter housing connector port 324 may be electrically coupled with the power inverter 203. In other examples, the inverter housing connector port 324 may be included with the power inverter 203.

The engagement of the connector ports 318, 324 allows power generated by the PV module 100 to be received by the power inverter 203. The docking member 208 may include a plurality of docking arms 326, each having a respective opening 328. The inverter housing 202 may include a plurality of docking tabs 330 extending outwardly from the inverter housing 202. In FIG. 3, the docking tabs 330 the docking tabs extend outwardly from the inverter housing cover 205 of the inverter housing 202. However, in other examples, some or all of the docking tabs 330 may extend from the inverter housing enclosure 207. Each docking tab 330 may include a respective opening 332. The docking arms 326 and docking tabs 330 may be positioned such that the openings 328 of each docking arm 326 and the openings 332 of each docking tab 330 align when the connector ports 318, 324 are coupled to one another. Upon alignment of the openings 328, 332, the fasteners 220 may be disposed through the aligned openings 328, 332 to secure the inverter housing 202 to the docking member 208. In one example, the rails 216, 218 of the docking member 208 may assist in the physical alignment of the inverter housing connector port 324 with the PV connector port 318.

Figure 4:
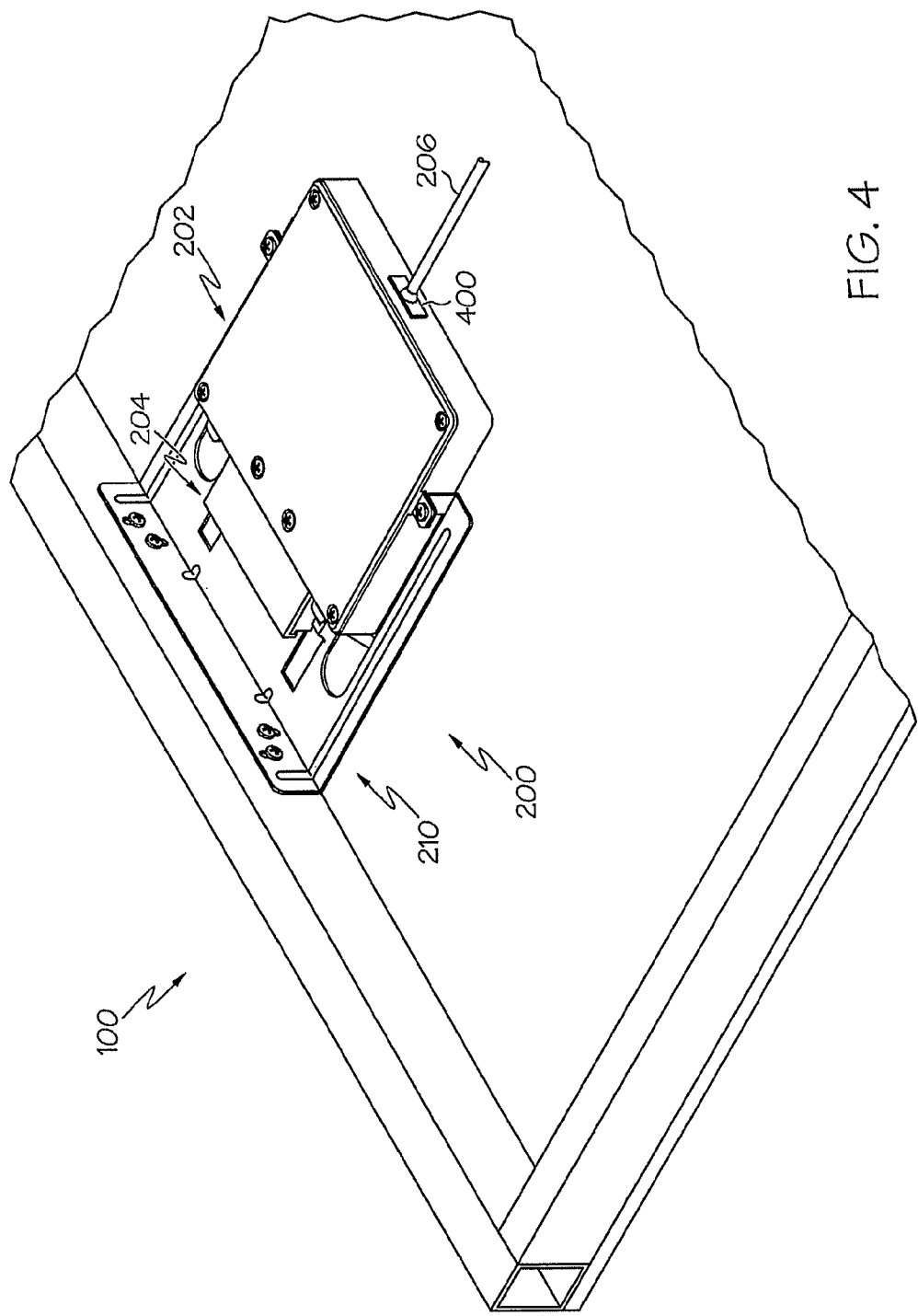
FIG. 4 is a different perspective view of the PV module including the example power inverter docking system of FIG. 2.

FIG. 4 is another perspective view of the docking system 200 and the PV module 100. The inverter housing 202 may include a plate 400 coupled to the inverter housing enclosure 207 of the inverter housing 202 to which the cable 206 is coupled.

FIG. 5 is a plan view of an example of the enclosure 302. The plan view illustrates an example placement and configuration of the docking projections 310, 312. The tabs 225, 227 are disposed along the projections 310, 312, respectively. The tabs 225, 227 may be separately coupled to the projections, 310, 312, respectively, or may be integrally formed thereon.

The PV connector port 318 may include a junction box connector plate 500 coupled to the enclosure 302 through one or more fasteners 502, such as screws, bolts, rivets, or other suitable fastener for removable or permanent coupling. The connector plate 500 may include a first guide post cavity 504 and second guide post cavity 505 formed within the connector plate 500. The guide post cavities 504, 505 may receive guide posts 700, 702 (FIG. 7) from the inverter housing connector port 324. The PV connector port 318 may also include a plurality of sockets 506. The sockets 506 may receive connector pins 704 (FIG. 7) from the inverter housing connector port 324. Receipt of the connector pins 704 may result in electrical coupling between the power inverter 203 and the PV module 100 as described with regard to FIGS. 2 and 3. The sockets 506 may be electrically coupled to a printed wiring board (PWB) 508. The PWB 508 may have a portion overlapping the PV connector port 318. The PWB 508 may be directly coupled to the sockets 506 or through intervening conductors (not shown). The PWB 508 may be electrically connected with the connectors 322 of the PV module 100 and may include conductors 800 (see FIG. 8) to electrically couple the connectors 322 to the sockets 506 on the PWB 508.

Figure 6:
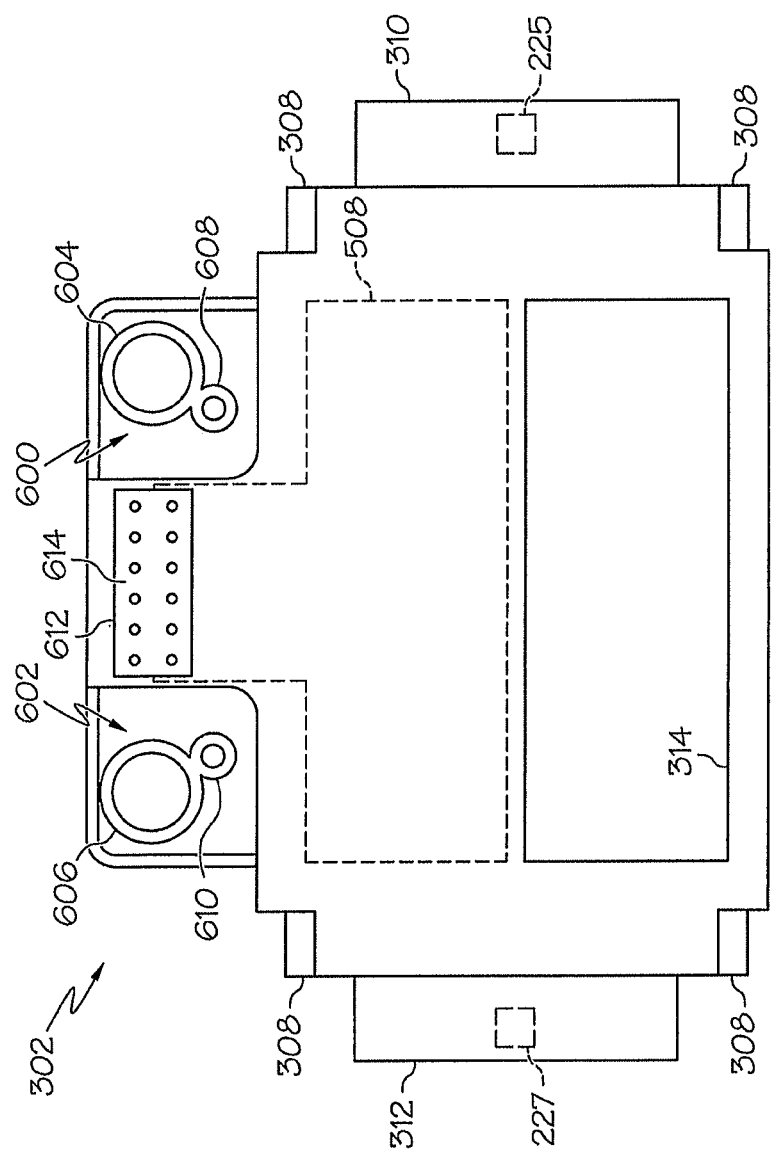
FIG. 6 is another plan view of the example junction box of FIG. 5.

FIG. 6 is a plan view of the enclosure 302 from an opposite view as that shown in FIG. 5. The plan view of FIG. 6 illustrates cavities 600, 602 formed by the enclosure 302. Disposed in each cavity 600, 602 are enclosure receptacles 604, 606, respectively, formed in the enclosure 302 to receive the portion of the connector plate 500 forming the guide post cavities 504, 505. Also disposed in each cavity 600, 602 is a fastener receptacle 608, 610, respectively, that may be formed in the enclosure 302 to receive the fastener 502, respectively, to couple the connector plate 500 to the enclosure 302. The enclosure 302 may also include an opening 612 allowing access to a socket connector board 614.

Figure 7:
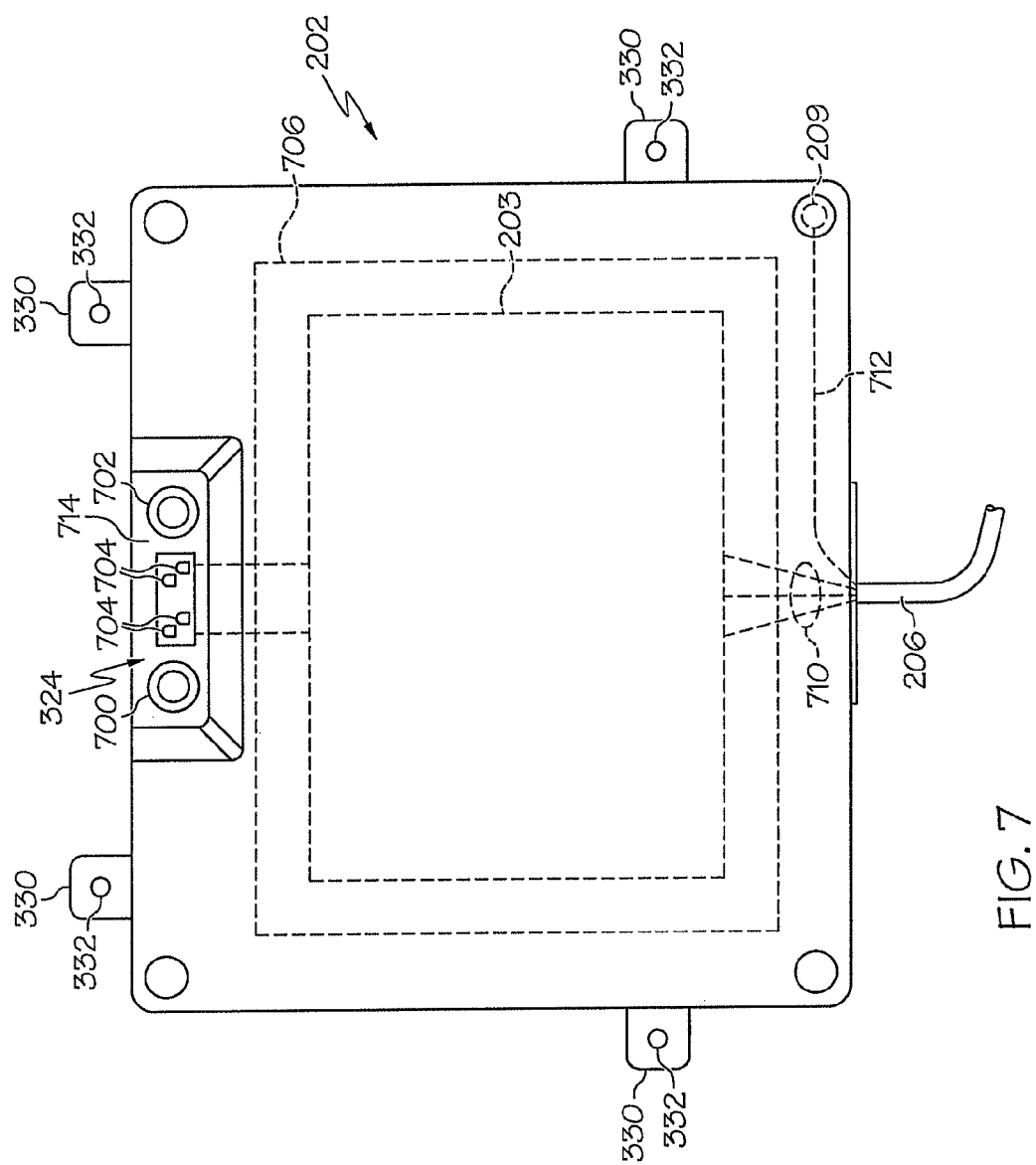
FIG. 7 is a plan view of an example inverter housing of the power inverter docking system of FIG. 2.

FIG. 7 is a plan view of the inverter housing 202. The inverter housing connector port 324 may include guide posts 700, 702. As discussed with regard to FIG. 5, the guide posts 700, 702 may be formed to be received by the guide post cavities 504, 505, respectively, when the connector ports 318, 324 are connected to one another. The inverter housing connector port 324 may also include a plurality of connector pins 704. The connector pins 704 may be electrically coupled to a PWB 706 (shown conceptually in phantom) internal to the inverter housing 202. The power inverter 203 may be electrically coupled to the PWB 706. The power inverter 203 may include a plurality of circuit elements arranged to convert DC power from the PV module 100 to AC power transmitted through the conductors 710 within the cable 206. The conductor 712 may serve as a grounding conductor and be coupled to a fastener 209. The conductors 710, 712 within the cable 206 may be connected to a number of other PV modules, a utility power grid, a stand-alone AC power load, or some combination of thereof.

The PV connector port 324 may include a connector plate 714 that includes the connector pins 704. The connector plate 714 may be removably coupled to the inverter housing 202 through one or more fasteners, such as fasteners 209 shown in FIG. 2.

Figure 8:
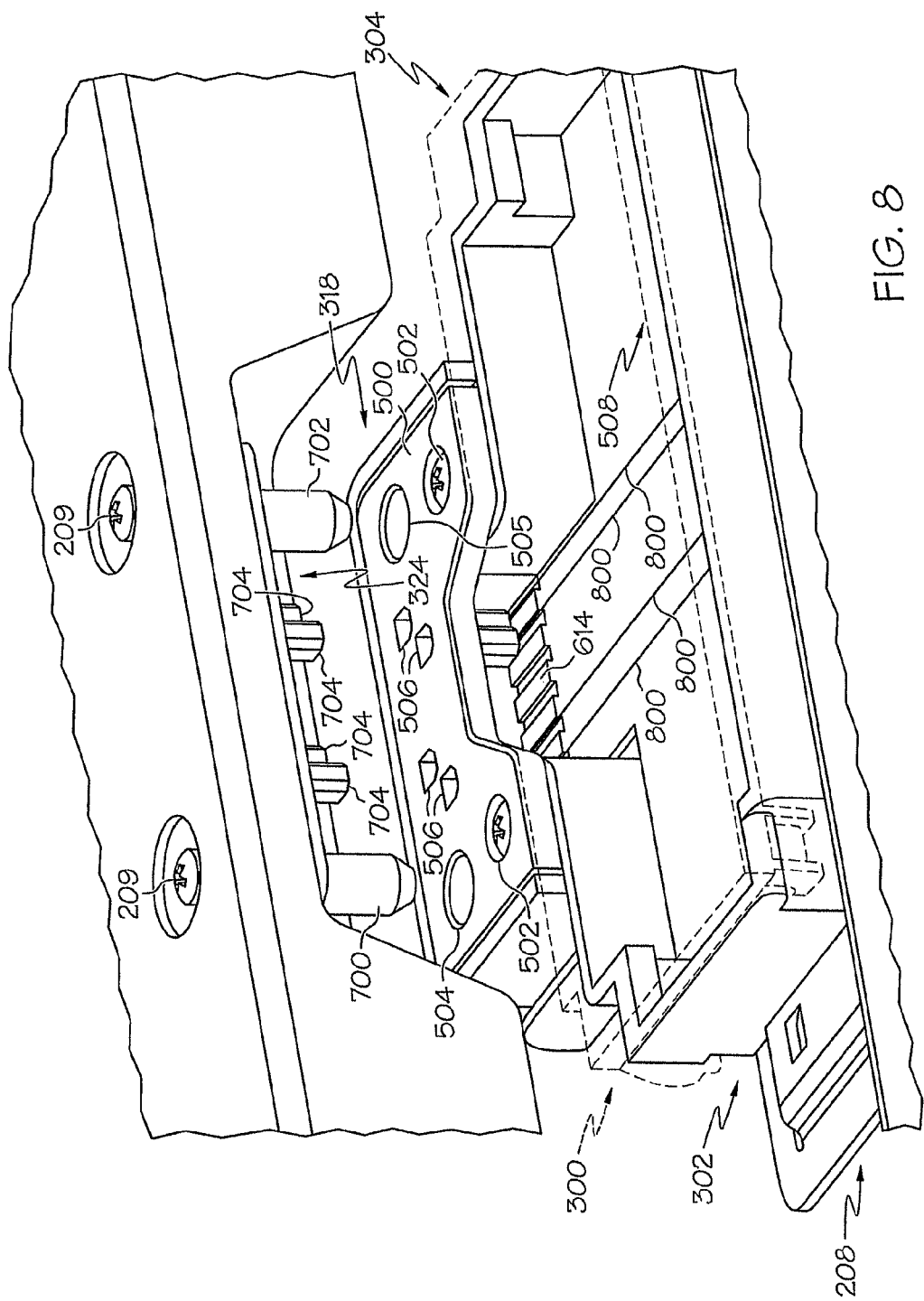
FIG. 8 is a perspective view of the junction box of FIG. 5 and the inverter housing of FIG. 7 prior to connection.

FIG. 8 is a perspective view of an example of the inverter housing connector port 318 prior to connection with the PV connector port 324. FIG. 8 provides an internal view of the enclosure 302. The PWB 508 may provide a surface for the conductors 800 to span for connection with the sockets 506. The sockets 506 may be mounted to the socket mounting board 614. The conductors 800 may be the connectors 322 of the PV module 100 or may be intervening conductors between the connectors 322 and the sockets 506. The connections between the connectors 322 and the sockets 506 may be made in various manners, such as crimping, soldering, or other manner of connection allowing electrical coupling of the sockets 506 to the connectors 322.

FIG. 8 also shows an example of the guide posts 700, 702 being connected to the inverter housing connector port 324 through fasteners 209 disposed through the inverter housing cover 205 of the inverter housing 202. In the example of FIG. 8, the guide posts 700, 702 may extend farther outwardly from the connector plate 714 than the connector pins 704 allowing receipt of the guide posts 700, 702 by the guide posts cavities 504, 505, respectively, to align the connector pins 704 with the sockets 506 prior to the connector pins 704 being received by the sockets 506.

FIGS. 9 and 10 are elevation views of an example alternative junction box 900 and example inverter housing 1000, respectively. The junction box 900 may be substantially similar to the junction box 204, except the junction box 900 may include a PV connector port 902 rotated substantially ninety degrees from the relative arrangement of the PV connector port 318. Similarly, the inverter housing 1000 may be substantially similar to the inverter housing 202 except the inverter housing 1000 may include an inverter housing connector port 1002 rotated substantially ninety degrees relative to the arrangement of the inverter housing connector port 324.

The arrangement of the connector ports 902, 1002 allows the inverter housing 1000 to approach the junction box 900 in a direction along, or along a plane substantially parallel to, the surface 214 of the PV module 100. The PV connector port 902 may include a connector plate 904 having a first guide post cavity 906 and second guide post cavity 908 formed therein. The connector plate 904 may also include a plurality of sockets 910 formed therein and configured to be electrically coupled to the PV module 100 in a manner similar to that described with regard to FIGS. 2-4.

The inverter housing connector port 1002 may include a connector plate 1004 having a first guide post 1006 and a second guide post 1008. The connector plate 1004 may also include a plurality of connector pins 1010. The connector pins 1010 may be configured to be received by the sockets 910 of the junction box 900 and the guide posts 1006, 1008 may each be received by a guide post cavity 906, 908, respectively, of the PV connector port 902.

Figure 11:
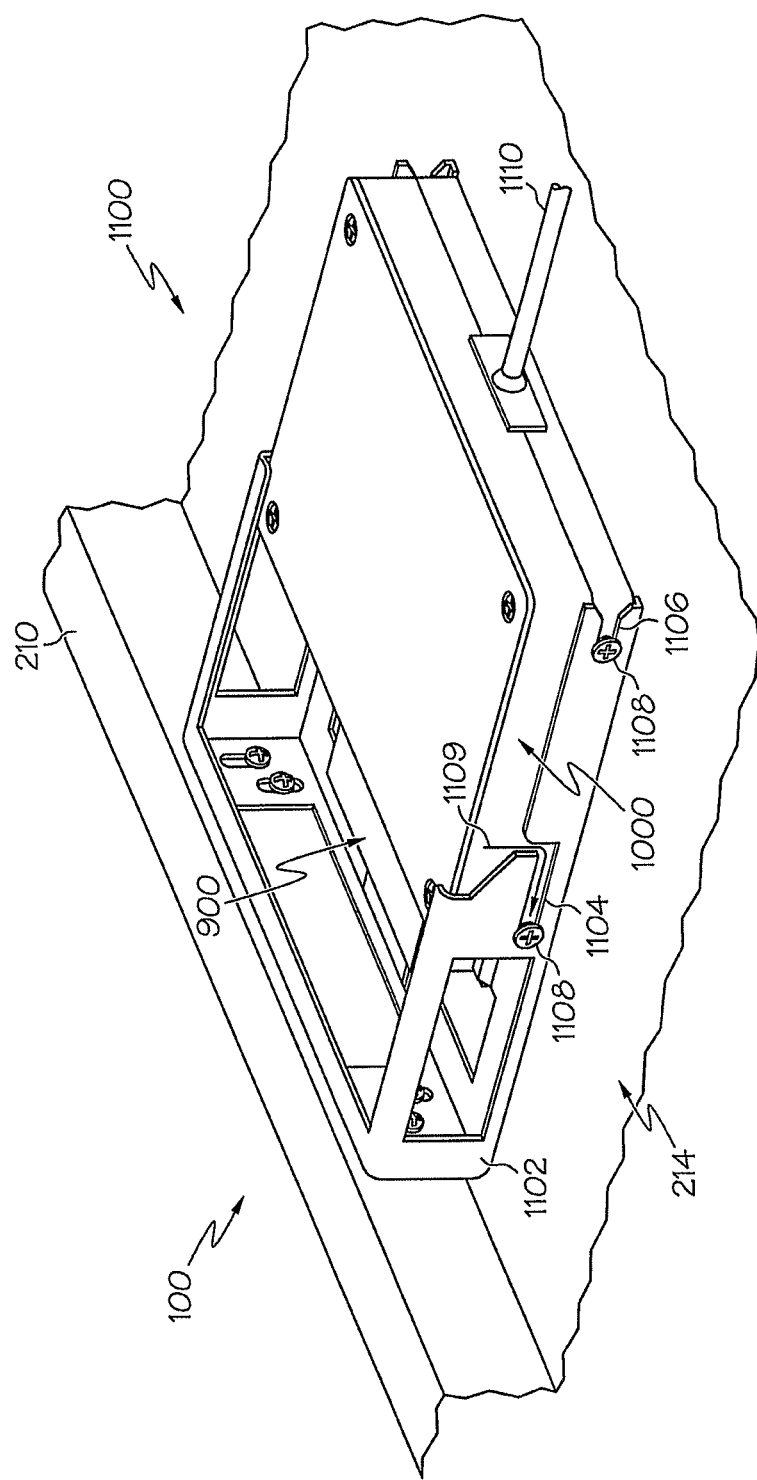
FIG. 11 is a perspective view of a photovoltaic module having an alternative power inverter docking system.

FIG. 11 is a perspective view of a docking system 1100 including the junction box 900 and the inverter housing 1000. FIG. 11 shows the PV connector port 902 coupled to the inverter housing connector port 1002. The docking system 1100 may include a docking member 1102 removably coupled to the rail 210 of the PV module 100. The junction box 900 may be removably coupled to the docking member 1102 in a manner similar to that described with regard to FIGS. 2-4. The docking member 1102 may include a plurality of front guides 1104 and back guides 1106. Each guide 1104, 1106 may be a slot formed to receive a fastener 1108. Each fastener 1108 may removable from the inverter housing 1000. Each fastener 1108 may be a threaded fastener such as a bolt or screw.

In coupling the junction box 900 and the inverter housing 1000, the inverter housing 1000 may be positioned such the fasteners 1108 corresponding to the front guides 1104 may enter the front guides 1104. The inverter housing 1000 may be slid toward the junction box 900 allowing the fasteners 1108 disposed in the front guides 1104 to move along the front guides 1104 and allowing the fasteners 1108 corresponding to back guides 1106 to be received by the back guides 1106. Arrow 1109 indicates the path of the fastener 1108 in the front guide 1104.

In the position shown in FIG. 11, the fasteners 1108 may be moved into the inverter housing 1102 allowing the docking member 1100 to be pressed between the fasteners 1108 and the inverter housing 1000 to secure the inverter housing 1000 into place. As the inverter housing 1000 is slid into the position shown in FIG. 11, the connector pins 1010 and guide posts 1006, 1008 of the inverter housing connector port 1002 may be received by the sockets 910 and the guide post openings 906, 908, respectively, electrically coupling the PV module 100 and a power inverter (not shown) housed by the inverter housing 1000. An electrical cable 1110 may internally include one or more conductors electrically coupled to the power inverter to transfer DC power generated by the PV module 100 to an AC load, similar to that described with regard to FIG. 7. In alternative configurations, the guides 1104, 1106 may be formed with a locking mechanism to clip the fasteners 1108 into place allowing the fasteners 1108 to be captured by the guides 1104, 1106, eliminating the need to press the docking member 1100 between the fasteners 1108 and the inverter housing 1000.

Figure 12:
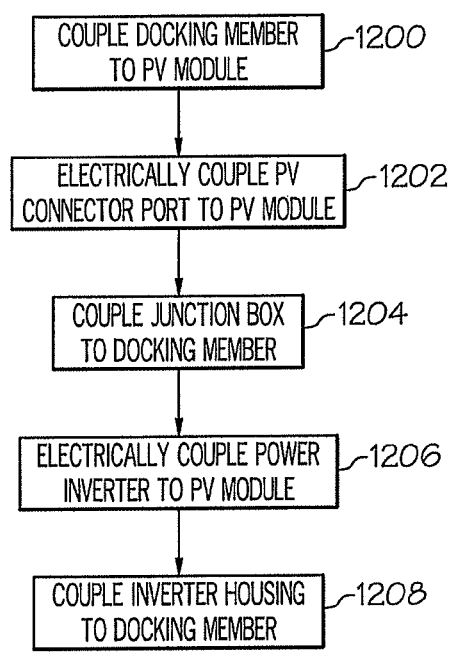
FIG. 12 is an example operational flow diagram for assembling a power inverter docking system for a photovoltaic module.

FIG. 12 is an example operational flow diagram for assembling a power inverter docking system of a PV module, such as the docking system 200. At block 1200, the docking member 208 may be coupled to the PV module 100. In one example, the docking member 208 may include a bracket 211 that may be removably or permanently fastened to the rail 210 of the PV module 100. The docking member 208 may also be removably or permanently coupled to the surface 214 of the PV module 100. In alternative examples, the docking member 208 may integrally formed with the PV module 100 eliminating the need to couple the docking member 208 to the PV module 100.

At block 1202, the PV connector port 318 may be electrically coupled to the PV module 100. In one example the PV connector port 318 may be electrically coupled to the connectors 322 of the PV module 100 allowing the connector port 318 to receive power generated by the PV module 100 based on solar energy received by the PV cells 102. In one example, the sockets 506 of the connector port 318 may be electrically coupled to the connectors 322.

At block 1204, the PV connector port 318 may be removably coupled to the docking member 208. In one example, the PV connector port 318 may be included in a junction box 204. The junction box 204 may be secured to the docking member 208 in a manner described with regard to FIGS. 2 and 3. At block 1206, the power inverter 203 may be electrically coupled to the PV module 100. In one example, the power inverter 203 may be housed by the inverter housing 202 that includes the inverter housing connector port 324. The inverter housing connector port 324 may be electrically coupled to the power inverter 203 as discussed with regard to FIGS. 2 and 7. The connector ports 318, 324 may be connected to one another to electrically couple the power inverter 203 to the PV module 100.

At block 1208, the inverter housing 202 may be coupled to the docking member 208. In one example, the inverter housing 202 may be coupled to the docking member 208 through aligning openings 332 in the docking tabs 330 with openings 328 in the docking arms 326 and disposing fasteners 220 through the aligned openings to removably couple the inverter housing 202 to the docking member 208. Alternative manners of assembling a docking system may be performed based on the operational flow diagram of FIG. 12, such the alternative configuration docking system 1100 described with regard to FIGS. 9-11. The operational flow diagram of FIG. 12 may include additional or fewer blocks than that described. Furthermore, the blocks of FIG. 12 may be arranged in an order alternative from that described.

While various embodiments of the innovation have been described, it will be apparent to those of ordinary skill in the art that many more embodiments and implementations are possible within the scope of the innovation. Accordingly, the innovation is not to be restricted except in light of the attached claims and their equivalents.

The invention claimed is:

1. A power inverter docking system for a photovoltaic module, the power inverter docking system comprising:
 a docking member adapted to be removably coupled to the photovoltaic module, wherein the docking member comprises a base surface having a first access opening defined therein; and
 a junction box adapted to be secured to the docking member, wherein the junction box comprises:
  a bottom surface having a second access opening defined therein, wherein the first access opening and the second access opening cooperate to define a passageway when the junction box is secured to the docking member;
  a first connector port adapted to be electrically coupled to the photovoltaic module by a connector routed through the passageway; and
  a second connector port adapted to be electrically coupled to a power inverter.

2. The power inverter docking system of claim 1, wherein the docking member comprises at least one docking slot adapted to secure the junction box to the docking member.

3. The power inverter docking system of claim 1, wherein the junction box comprises a port structure that includes the first connector port and the second connector port.

4. The power inverter docking system of claim 1, wherein the junction box comprises a port structure having a first wall and a second wall perpendicular to the first wall;
 wherein the first connector port is defined in the first wall; and
 wherein the second port is defined in the second wall.

5. The power inverter docking system of claim 1, wherein the junction box comprises a port structure having a first wall and a second wall parallel to the first wall;
 wherein the first connector port is defined in the first wall; and
 wherein the second port is defined in the second wall.

6. The power inverter docking system of claim 1, wherein the connector comprises an electrical wire.

7. The power inverter docking system of claim 1, wherein the second connector port comprises a plurality of electrically-conductive sockets.

8. The power inverter docking system of claim 1, wherein the junction box is adapted to be removably coupled to the docking member.

9. The power inverter docking system of claim 1, further comprising a housing adapted to be removably coupled to the docking member, wherein the housing includes the power inverter.

10. A junction box for electrically coupling a photovoltaic module to an electronic device, the junction box comprising:
 a bottom surface having a first access opening defined therein, wherein the first access opening cooperates with a second access opening defined in a base of a docking member to define a passageway when the junction box is secured to the docking member;
 a first connector port adapted to be electrically coupled to the photovoltaic module by a connector routed through the passageway; and
 a second connector port adapted to be electrically coupled to the electronic device.

11. The junction box of claim 10, wherein the electronic device is a power inverter.

12. The junction box of claim 10, further comprising a port structure that includes the first connector port and the second connector port.

13. The junction box of claim 10, further comprising a port structure having a first wall and a second wall perpendicular to the first wall;
 wherein the first connector port is defined in the first wall; and
 wherein the second port is defined in the second wall.

14. The junction box of claim 10, further comprising a port structure having a first wall and a second wall parallel to the first wall;
 wherein the first connector port is defined in the first wall; and
 wherein the second port is defined in the second wall.

15. The junction box of claim 10, wherein the second connector port comprises a plurality of electrically-conductive sockets.

16. The junction box of claim 10, further comprising at least one docking projection adapted to be removably coupled to at least one corresponding docking slot of the docking member.

17. A method of assembling a docking system for a photovoltaic module, the method comprising:
 securing a docking member to the photovoltaic module, wherein the docking member includes a base surface having a first access opening defined therein;
 electrically coupling a first connector port of a junction box to at least one photovoltaic cell of the photovoltaic module through a passageway defined by the first access opening and a second access opening defined in a bottom surface of the junction box; and
 securing the junction box to the docking member.

18. The method of claim 17, further comprising electrically coupling the first connector port to a power inverter module.

19. The method of claim 18, wherein electrically coupling the first connector port to the power inverter module comprises electrically coupling the first connector port to a second connector port that is electrically coupled to the power inverter module, wherein the power inverter module is enclosed within a housing; and further comprising removably coupling the housing to the docking member.

20. The method of claim 17, wherein securing the docking member to the photovoltaic module comprises securing the docking member to an outer surface of the photovoltaic module such that the base surface of the docking member is parallel to the outer surface.

* * * * *